(12) United States Patent
Hahakura et al.

(10) Patent No.: US 7,858,558 B2
(45) Date of Patent: Dec. 28, 2010

(54) SUPERCONDUCTING THIN FILM MATERIAL AND METHOD OF MANUFACTURING THE SAME

(75) Inventors: Shuji Hahakura, Osaka (JP); Kazuya Ohmatsu, Osaka (JP); Munetsugu Ueyama, Osaka (JP); Katsuya Hasegawa, Osaka (JP)

(73) Assignees: Sumitomo Electric Industries, Ltd., Osaka-shi, Osaka (JP); International Superconductivity Technology Center, the Juridical Foundation, Tokyo (JP)

( * ) Notice: Subject to any disclaimer, the term of this patent is extended or adjusted under 35 U.S.C. 154(b) by 0 days.

(21) Appl. No.: 12/299,141

(22) PCT Filed: Apr. 20, 2007

(86) PCT No.: PCT/JP2007/058657

§ 371 (c)(1),
(2), (4) Date: Oct. 31, 2008

(87) PCT Pub. No.: WO2007/135832

PCT Pub. Date: Nov. 29, 2007

(65) Prior Publication Data

US 2009/0137400 A1    May 28, 2009

(30) Foreign Application Priority Data

May 19, 2006   (JP) ............................. 2006-140172

(51) Int. Cl.
*H01L 39/12*    (2006.01)
*H01L 29/06*    (2006.01)
*B05D 5/12*     (2006.01)

(52) U.S. Cl. ...................... 505/234; 505/813; 505/191; 427/62

(58) Field of Classification Search ................. 505/813, 505/191, 234; 427/62
See application file for complete search history.

(56) References Cited

U.S. PATENT DOCUMENTS

| | | | |
|---|---|---|---|
| 5,032,568 A * | 7/1991 | Lau et al. ...................... 505/477 |
| 5,164,363 A * | 11/1992 | Eguchi et al. ................ 505/447 |
| 5,185,317 A * | 2/1993 | Wessels et al. .............. 505/447 |
| 5,296,460 A * | 3/1994 | Wessels et al. .............. 505/447 |
| 5,883,050 A * | 3/1999 | Yun et al. .................... 505/125 |
| 6,172,009 B1 * | 1/2001 | Smith et al. ................. 505/473 |
| 6,673,387 B1 * | 1/2004 | Zhang et al. ................... 427/62 |
| 6,794,339 B2 * | 9/2004 | Wiesmann et al. .......... 505/470 |
| 6,797,313 B2 * | 9/2004 | Fritzemeier et al. ........... 427/62 |
| 6,974,501 B1 * | 12/2005 | Zhang et al. .................. 117/84 |
| 2006/0014304 A1 | 1/2006 | Hahakura et al. |

FOREIGN PATENT DOCUMENTS

| JP | 7-206437 | 8/1995 |
|---|---|---|
| JP | 2002-75079 | 3/2002 |
| JP | 2005-038632 | 2/2005 |
| JP | 2005-93205 | 4/2005 |
| SU | 1829818 | 7/1995 |

* cited by examiner

*Primary Examiner*—Douglas Mc Ginty
(74) *Attorney, Agent, or Firm*—Drinker Biddle & Reath LLP

(57) ABSTRACT

A superconducting thin film material that can realize attainment of an excellent property such as a high $J_C$ and a high $I_C$ and reduction of costs at the same time includes an orientated metal substrate and an oxide superconductor film formed on the orientated metal substrate. The oxide superconductor film includes a physical vapor deposition HoBCO layer formed by a physical vapor deposition method, and a metal organic deposition HoBCO layer formed on the physical vapor deposition HoBCO layer by a metal organic deposition method.

7 Claims, 11 Drawing Sheets

Ic : 81A/cm-WIDTH
MOD FILM : 0.3 μm

1μm

Ic : 74A/cm-WIDTH
MOD FILM : 0.9 μm

1μm

Ic : 39A/cm-WIDTH
MOD FILM : 1.8 μm

1μm

SUPERCONDUCTING THIN FILM MATERIAL AND METHOD OF MANUFACTURING THE SAME

TECHNICAL FIELD

The present invention relates to a superconducting thin film material and a method of manufacturing the same, and more particularly to a superconducting thin film material having a superconductor film formed on a substrate and a method of manufacturing the same.

BACKGROUND ART

In recent years, superconducting thin film materials have been developed, such as a superconducting tape wire having a superconductor film formed on a metal substrate by a Physical Vapor Deposition (PVD) method such as a Pulsed Laser Deposition (PLD) method as well as a Metal Organic Deposition (MOD) method such as a Trifluoroacetate-Metal Organic Deposition (TFA-MOD) method. For example, a method of efficiently producing an oxide superconducting wire having a large critical current density ($J_C$) is proposed. The oxide superconducting wire is produced by setting a transfer speed of a metal tape as well as a distance between the metal tape and a target for generating an oxide to prescribed values respectively when an oxide superconductor layer is formed on the metal tape by a PLD method or the like (Japanese Patent Laying-Open No. 2005-38632 (Patent Document 1)).

Patent Document 1: Japanese Patent Laying-Open No. 2005-38632

DISCLOSURE OF THE INVENTION

Problems to be Solved by the Invention

When a superconductor film is formed by employing a PVD method, particularly a PLD method, there is an advantage that a superconducting thin film material having a composition of the superconductor film close to that of a target and having a high $J_C$ and a high critical current ($I_C$) can be obtained. It is required, however, to form the film under a reduced pressure if the PVD method is employed. Therefore, efficient mass production is difficult and manufacturing costs increase. When the superconductor film is formed by employing the PVD method, there is also a problem that an increased film thickness leads to a reduction in a surface smoothness of the film.

On the other hand, when a superconductor film is formed by employing an MOD method, it is relatively easy to simplify production facilities. Therefore, as compared to the case where the PVD method is employed, there is an advantage that costs related to production facilities can be reduced with relative ease and an inexpensive superconducting thin film material can be produced. The superconductor film formed by the MOD method has also an advantage of having an excellent surface smoothness. However, in a TFA-MOD method, for example, crystals of the superconductor film grow while fluorine separates from within the superconductor film in a film formation process. Therefore, the growth rate of the crystals of the superconductor film is slow and it is not necessarily easy to improve production efficiency. In addition, it is difficult to manufacture, for example, a wide superconducting thin film material because the above-described separation of the fluorine needs to be promoted uniformly, and an improvement in the production efficiency is inhibited. Furthermore, in the TFA-MOD method, hydrogen fluoride which requires careful handling is generated during the process. Therefore, the cost of processing the hydrogen fluoride is required, which causes an increase in production costs of the superconducting thin film material.

The above-described problems of the TFA-MOD method can be solved by employing a non-fluorine-containing MOD method in which a fluorine-containing organometallic salt solution is not used. The non-fluorine-containing MOD method, however, has a problem that the nucleus growth of the superconductor film from a substrate and an intermediate layer formed on the substrate is not easily accomplished.

As described above, it is conventionally difficult to realize attainment of an excellent property such as a high $J_C$ and a high $I_C$ and reduction of costs in the superconducting thin film material at the same time.

Therefore, an object of the present invention is to provide a superconducting thin film material that can realize attainment of an excellent property such as a high $J_C$ and a high $I_C$ and reduction of costs at the same time, and a method of manufacturing the same.

Means for Solving the Problems

A superconducting thin film material according to the present invention includes a substrate and a superconductor film formed on the substrate. The superconductor film includes a physical vapor deposition layer formed by a physical vapor deposition method, and a metal organic deposition layer formed on the physical vapor deposition layer by a metal organic deposition method.

In order to provide an excellent property such as a high $J_C$ and a high $I_C$ for the superconducting thin film material, it is important to form a superconductor film having a sufficient film thickness while a high surface smoothness and a high orientation are ensured in the superconductor film. The present inventor has made a close study of a superconducting thin film material that can achieve the foregoing at low cost, and a method of manufacturing the same. As a result, the inventor has found out that a physical vapor deposition film as a superconductor film having its composition close to that of a target and having a high orientation is first formed by a physical vapor deposition method (PVD method), and then a metal organic deposition layer as a superconductor film is formed on the physical vapor deposition film by a metal organic deposition method (MOD method), and thus a superconductor film having a high orientation and a high surface smoothness can be formed at low cost. According to this manufacturing method, a low-cost superconducting thin film material having an excellent property such as a high $J_C$ and a high $I_C$ can be manufactured. That is, if the superconductor film is formed only by the PVD method as described above, the surface smoothness tends to be reduced as the superconductor film becomes thick. Formation of the overall superconductor film by the PVD method in combination with the MOD method providing an excellent surface smoothness rather than only by the PVD method leads to an improvement in the surface smoothness of the superconductor film. If the metal organic deposition layer is formed by using the physical vapor deposition layer as a seed film, the nucleus growth of the metal organic deposition layer is more easily accomplished. Thus, according to the superconducting thin film material of the present invention, there can be provided a superconducting thin film material that can realize attainment of an excellent property such as a high $J_C$ and a high $I_C$ and reduction of costs at the same time because respective disadvantages of the PVD method and the MOD method are compensated for each other and their advantages are maximized.

"Orientation" herein means to what extent a crystal orientation of crystal grains is aligned. "Surface smoothness" means the flatness of a film surface.

Preferably, the above-described superconducting thin film material further includes an intermediate layer between the substrate and the superconductor film. Since the intermediate layer is interposed between the substrate and the superconductor film, the orientation of the superconductor film can be improved. In addition, the diffusion and reaction of atoms between the substrate and the superconductor film can be suppressed. As a result, the property of the superconducting thin film material can be improved and the range of choices about the substrate can be extended.

Preferably, in the above-described superconducting thin film material, the superconductor films are formed on both main surfaces of the substrate. As the film thickness is increased, a condition for the film formation needs to be exactly controlled because it becomes difficult to ensure the surface smoothness and to suppress internal defects such as voids in the superconductor film. In order to address this, since the superconductor films are formed on both main surfaces of the substrate, the film thickness of the superconductor film on each main surface required to ensure a desired $I_C$ across the superconducting thin film material can be reduced. As a result, it is easy to ensure the surface smoothness and to suppress the internal defects such as voids in the superconductor film on each main surface, and it is possible to ensure a sufficient $I_C$ by the superconductor films on both main surfaces.

Preferably, in the above-described superconducting thin film material, a plurality of structures made up of a combination of the physical vapor deposition layer and the metal organic deposition layer are stacked in the superconductor film. As described above, in the physical vapor deposition layer formed by the PVD method, it becomes difficult to ensure the surface smoothness as the film thickness is increased. In the metal organic deposition layer formed by the MOD, it becomes difficult to suppress the internal defects such as voids as the film thickness is increased. In order to address this, since the physical vapor deposition layer is first formed, and then the metal organic deposition layer is formed on the physical vapor deposition layer, the surface smoothness can be improved. Furthermore, since the film thickness of the metal organic deposition layer is limited to such a degree that it is easy to suppress the internal defects such as voids, a physical vapor deposition layer is again formed on the superconductor film having an improved surface smoothness, and an additional metal organic deposition layer is formed on the physical vapor deposition layer, the film thickness of the superconductor film can be increased and the surface smoothness of the superconductor film is again improved. Thus, since a plurality of structures made up of a combination of the physical vapor deposition layer and the metal organic deposition layer are stacked, there can be provided a superconducting thin film material in which it is easy to ensure the surface smoothness and to suppress the internal defects such as voids, the superconductor film having a sufficient film thickness is formed, and a desired superconducting property such as $I_C$ and $J_C$ can be ensured.

In the above-described superconducting thin film material, the metal organic deposition layer preferably has a thickness of not more than 1 μm. In the metal organic deposition layer formed by the MOD method, the internal defects such as voids are likely to be created as the film thickness is increased. If the metal organic deposition layer has a thickness of not more than 1 μm, the creation of the internal defects such as voids can be suppressed with relative ease.

In the above-described superconducting thin film material, the physical vapor deposition layer preferably has a thickness of not more than 2 μm. In the physical vapor deposition layer formed by the PVD method, it becomes difficult to ensure the surface smoothness as the film thickness is increased. If the physical vapor deposition layer has a thickness of not more than 2 μm, a good surface smoothness can be ensured with relative ease.

Preferably, in the above-described superconducting thin film material, the above-described physical vapor deposition method is any vapor deposition method selected from the group consisting of a pulsed laser deposition method, a sputtering method and an electron beam method.

Among physical vapor deposition (PVD) methods, a pulsed laser deposition method, a sputtering method and an electron beam method are suited for the formation of the superconductor film having a high orientation, and they are suitable for the formation of the physical vapor deposition film of the present invention.

Preferably, in the above-described superconducting thin film material, the metal organic deposition method is a non-fluorine-containing metal organic deposition method in which a fluorine-containing organometallic salt solution is not used. Unlike a TFA-MOD method that is a typical deposition method of the metal organic deposition (MOD) method, the non-fluorine-containing metal organic deposition method is not a deposition method in which crystals of the superconductor film grow while fluorine separates from within the superconductor film in a film formation process. Therefore, the growth rate of the crystals of the superconductor film is fast and production efficiency can be improved. Since the above-described separation of the fluorine dose not need to be promoted uniformly, a wide superconducting thin film material, for example, can easily be manufactured, which can also contribute to the improvement in the production efficiency. In addition, the cost of processing hydrogen fluorine is unnecessary because the hydrogen fluorine which requires careful handling is not generated during the film formation process. Furthermore, since the process can be performed using a neutral solution, the metal organic deposition layer can be formed without damaging the physical vapor deposition layer that was previously formed when the non-fluorine-containing metal organic deposition method is applied to the superconducting thin film material of the present invention. As a result, manufacturing costs can be suppressed and a property of the superconducting thin film material of the present invention can further be improved.

The non-fluorine-containing metal organic deposition method is a metal organic deposition method in which the fluorine-containing organometallic salt solution is not used. A solution used in the metal organic deposition method includes, for example, a metal acetylacetonate-containing solution (Ho:Ba:Cu=1:2:3), a naphthenic acid-containing solution or the like.

A method of manufacturing a superconducting thin film material according to the present invention includes a substrate preparation step for preparing a substrate, and a superconductor film formation step for forming a superconductor film on the substrate. The superconductor film formation step includes a physical vapor deposition step for forming a physical vapor deposition layer by a physical vapor deposition method, and a metal organic deposition step for forming a metal organic deposition layer on the physical vapor deposition layer by a metal organic deposition method.

According to the method of manufacturing the superconducting thin film material of the present invention, as described above, the superconducting thin film material that can realize attainment of an excellent property such as a high $J_C$ and a high $I_C$ and reduction of costs at the same time can be manufactured because respective disadvantages of the PVD method and the MOD method are compensated for each other and their advantages are maximized.

The method of manufacturing the superconducting thin film material of the present invention further includes an intermediate layer formation step for forming an intermediate layer between the substrate and the superconductor film after the substrate preparation step and before the superconductor film formation step.

Since the intermediate layer is interposed between the substrate and the superconductor film, the orientation of the superconductor film can be improved, and the diffusion and reaction of atoms between the substrate and the superconductor film can be suppressed.

Preferably, in the method of manufacturing the superconducting thin film material of the present invention, the physical vapor deposition layers are formed on both main surfaces of the substrate in the physical vapor deposition step, and the metal organic deposition layers are formed on the physical vapor deposition layers on both main surfaces of the substrate.

Consequently, the film thickness of the superconductor film on each main surface is reduced, and thus it is easy to ensure the surface smoothness and to suppress internal defects such as voids. In addition, it is possible to ensure a sufficient $I_C$ by the superconductor films on both main surfaces.

Preferably, in the method of manufacturing the superconducting thin film material of the present invention, the physical vapor deposition step and the metal organic deposition step are alternately performed more than once.

Consequently, since a plurality of structures made up of a combination of the physical vapor deposition layer and the metal organic deposition layer are stacked, it is easy to ensure the surface smoothness and to suppress the internal defects such as voids, and it is possible to form the superconductor film having a sufficient film thickness. As a result, the superconducting thin film material that can ensure a desired superconducting property such as $I_C$ and $J_C$ can easily be manufactured.

Preferably, in the method of manufacturing the superconducting thin film material of the present invention, the metal organic deposition layer having a thickness of not more than 1 µm is formed in the metal organic deposition step. Consequently, the creation of the internal defects such as voids in the metal organic deposition layer can be suppressed with relative ease.

Preferably, in the method of manufacturing the superconducting thin film material of the present invention, the physical vapor deposition layer having a thickness of not more than 2 µm is formed in the physical vapor deposition step. Consequently, a good surface smoothness of the physical vapor deposition layer can be ensured with relative ease.

Preferably, in the method of manufacturing the superconducting thin film material of the present invention, the above-described physical vapor deposition method is any vapor deposition method selected from the group consisting of a pulsed laser deposition method, a sputtering method and an electron beam method.

Among physical vapor deposition (PVD) methods, a pulsed laser deposition method, a sputtering method and an electron beam method are suited for the formation of the superconductor film having a high orientation, and they are suitable for the formation of the physical vapor deposition film in the method of manufacturing the superconducting thin film material of the present invention.

Preferably, in the method of manufacturing the superconducting thin film material of the present invention, the above-described metal organic deposition method is a non-fluorine-containing metal organic deposition method in which the fluorine-containing organometallic salt solution is not used.

Consequently, unlike a TFA-MOD method that is a typical deposition method of the metal organic deposition (MOD) method, the growth rate of the crystals of the superconductor film is fast and production efficiency can be improved. The above-described separation of the fluorine dose not need to be promoted uniformly, which can contribute to the improvement in the production efficiency. In addition, the cost of processing hydrogen fluorine is unnecessary because the hydrogen fluorine which requires careful handling is not generated during the film formation process. Furthermore, since the process can be performed using a neutral solution, the metal organic deposition layer can be formed without damaging the physical vapor deposition film that was previously formed when the non-fluorine-containing metal organic deposition method is applied to the superconducting thin film material of the present invention. As a result, manufacturing costs can be suppressed and a property of the superconducting thin film material of the present invention can further be improved.

Effects of the Invention

As is apparent from the above-described description, according to a superconducting thin film material of the present invention and a method of manufacturing the same, there can be provided a superconducting thin film material that can realize attainment of an excellent property such as a high $J_C$ and a high $I_C$ and reduction of costs at the same time, and a method of manufacturing the same.

DESCRIPTION OF THE REFERENCE SIGNS 1 superconducting thin film material, 10 orientated metal substrate, 10A main surface, 20 intermediate layer, 21 first $CeO_2$ layer, 22 YSZ layer, 23 second $CeO_2$ layer, 30 oxide superconductor film, 30A superconductor film surface, 30B stacked structure, 31 physical vapor deposition HoBCO layer, 31A physical vapor deposition HoBCO layer surface, 32 metal organic deposition HoBCO layer, 32A metal organic deposition HoBCO layer surface, 40 Ag stabilizing layer

BEST MODES FOR CARRYING OUT THE INVENTION

The embodiments of the present invention will be described below with reference to the drawings. The same or corresponding parts are represented by the same reference numbers in the following drawings and the description thereof will not be repeated.

First Embodiment

A configuration of a superconducting thin film material of a first embodiment that is an embodiment of the present invention will be described with reference to FIG. 1.

Figure 1:
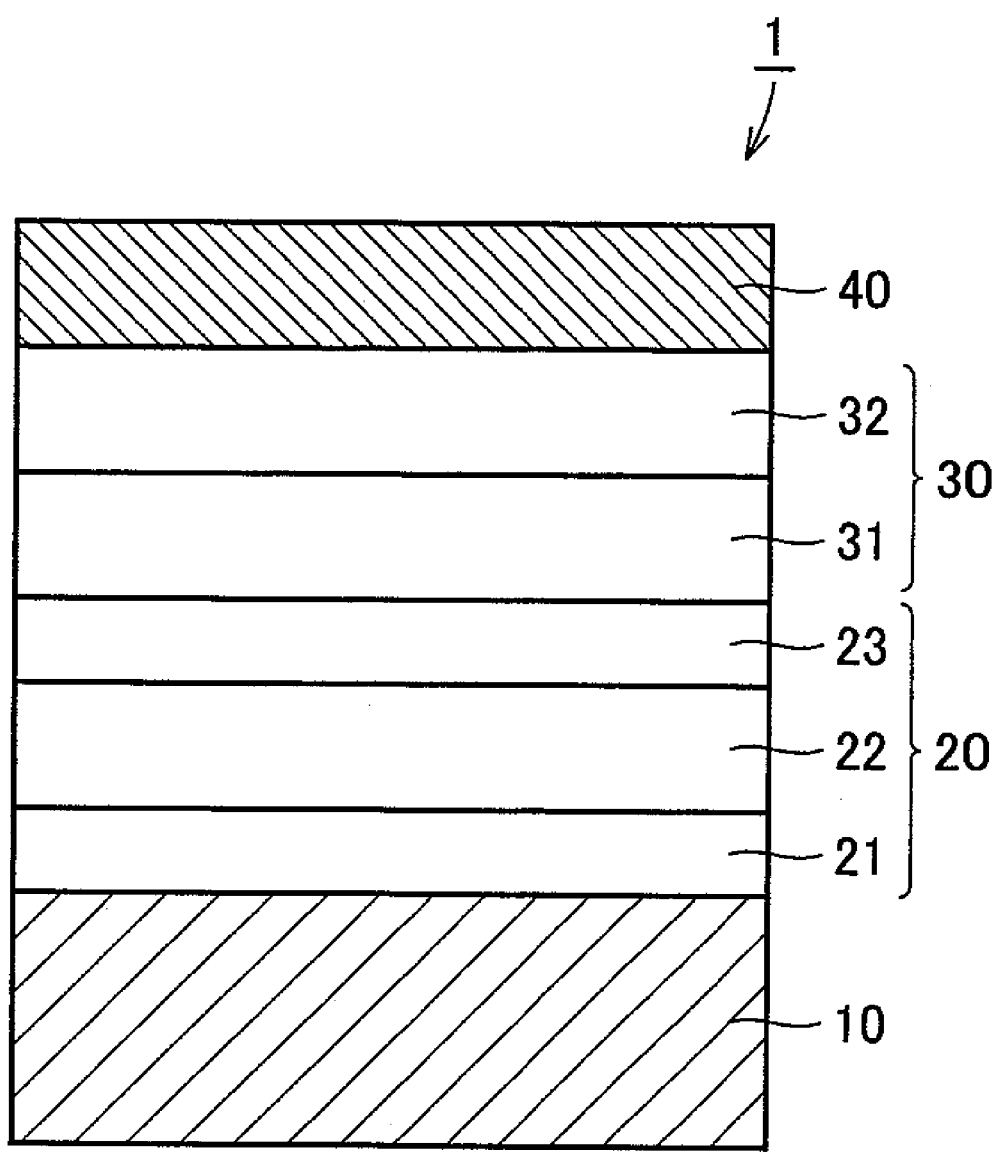
FIG. 1 is a schematic cross-sectional view of a configuration of a superconducting thin film material of a first embodiment.

Referring to FIG. 1, a superconducting thin film material 1 of the first embodiment includes an orientated metal substrate 10 as a substrate, an intermediate layer 20 formed on orientated metal substrate 10, an oxide superconductor film 30 as a superconductor film formed on intermediate layer 20, and an Ag (silver) stabilizing layer 40 as a stabilizing layer formed on oxide superconductor film 30 in order to protect oxide superconductor film 30. A rare-earth-containing oxide superconducting material such as HoBCO (a holmium-containing high temperature superconducting material; $HoBa_2Cu_3O_x$) can be selected as a material of oxide superconductor film 30. Oxide superconductor film 30 includes a physical vapor deposition HoBCO layer 31 as a physical vapor deposition layer formed by a physical vapor deposition method, and a metal organic deposition HoBCO layer 32 as a metal organic deposition layer formed on physical vapor deposition HoBCO layer 31 by a metal organic deposition method.

For example, an orientated Ni (nickel) substrate, an Ni alloy-containing orientated substrate or the like can be selected as orientated metal substrate 10. Intermediate layer 20 can include at least one of, for example, $CeO_2$ (ceria) and YSZ (yttria-stabilized zirconia), more specifically, a first $CeO_2$ layer 21, a YSZ layer 22 formed on first $CeO_2$ layer 21, and a second $CeO_2$ layer 23 formed on YSZ layer 22. The stabilizing layer is not limited to above-described Ag stabilizing layer 40. For example, a Cu stabilizing layer made from Cu (copper) may be used instead of Ag stabilizing layer 40.

The description of a method of manufacturing the superconducting thin film material of the first embodiment will follow with reference to FIGS. 1 to 6.

Figure 2:
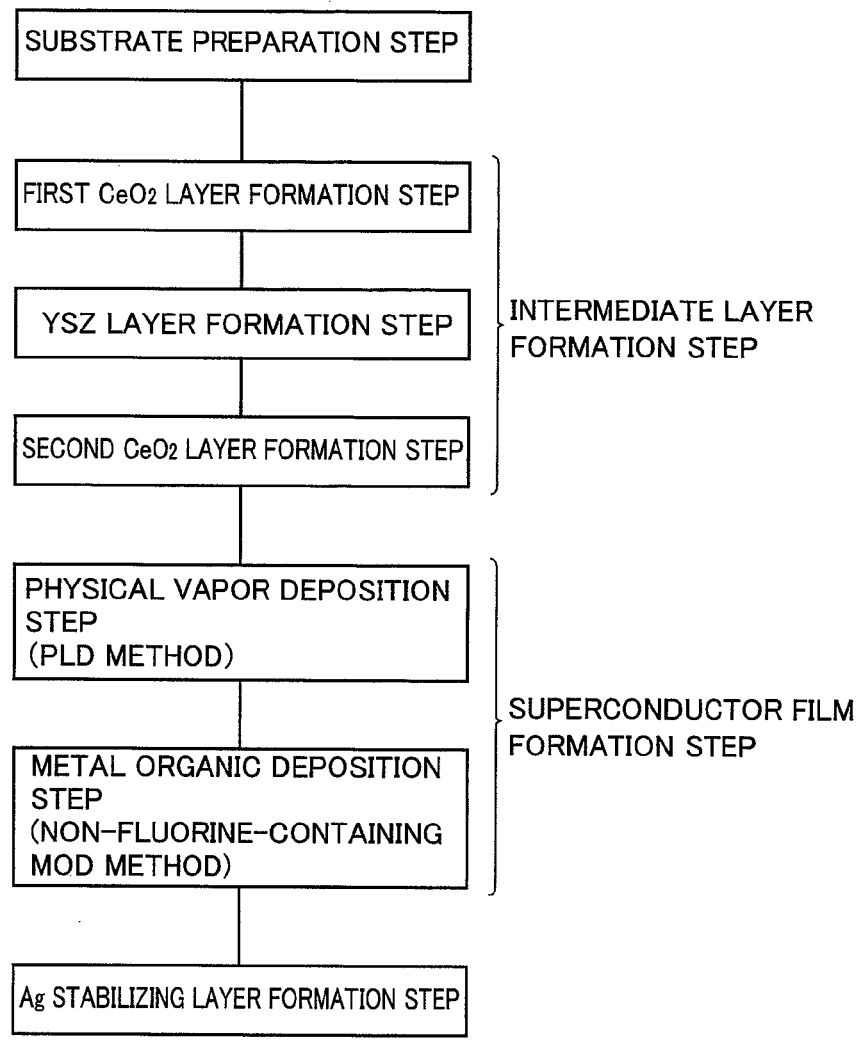
FIG. 2 is a chart showing the outline of manufacturing steps in a method of manufacturing the superconducting thin film material of the first embodiment.

Referring to FIG. 2, a substrate preparation step is performed first. Specifically, orientated metal substrate 10 such as a substrate in the form of a tape made from an orientated nickel alloy is prepared. Then, an intermediate layer formation step for forming intermediate layer 20 on orientated metal substrate 10 is performed as shown in FIG. 2. Specifically, referring to FIGS. 2 and 4, a first $CeO_2$ layer formation step, a YSZ layer formation step and a second $CeO_2$ layer formation step are in turn performed so that first $CeO_2$ layer 21, YSZ layer 22 and second $CeO_2$ layer 23 are in turn formed on orientated metal substrate 10. Although these first $CeO_2$ layer formation step, YSZ layer formation step and second $CeO_2$ layer formation step can be performed by a physical vapor deposition method, for example a PLD method or the like, they may be performed by an MOD method.

Figure 5:
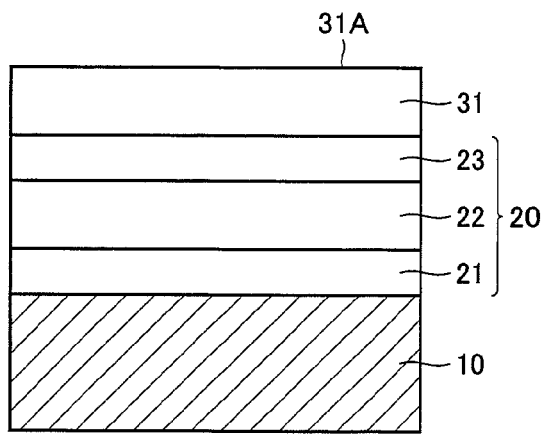
FIG. 5 is a schematic cross-sectional view for explaining the method of manufacturing the superconducting thin film material of the first embodiment.

Then, a superconductor film formation step for forming oxide superconductor film 30 on intermediate layer 20 is performed as shown in FIG. 2. Specifically, a physical vapor deposition step for forming physical vapor deposition HoBCO layer 31 on intermediate layer 20 by a physical vapor deposition method is performed first as shown in FIGS. 2 and 5. In this physical vapor deposition step, it is preferable to use any vapor deposition method selected from the group consisting of a pulsed laser deposition (PLD) method, a sputtering method and an electron beam method. In particular, by employing the PLD method, the composition of physical vapor deposition HoBCO layer 31 forming oxide superconductor film 30 can be close to that of a target and a high orientation can be ensured, which can contribute to an improvement in $J_C$ and $I_C$ of superconducting thin film material 1.

Figure 3:
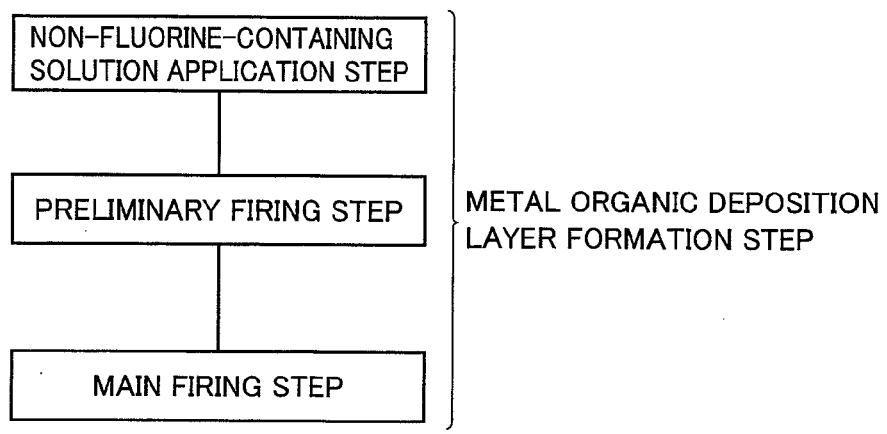
FIG. 3 is a chart showing the details of the metal organic deposition step in the manufacturing steps of FIG. 2.
Figure 4:
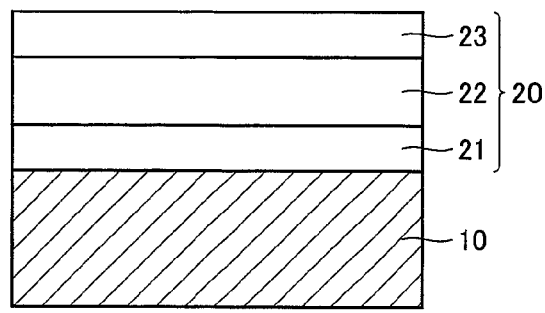
FIG. 4 is a schematic cross-sectional view for explaining the method of manufacturing the superconducting thin film material of the first embodiment.
Figure 6:
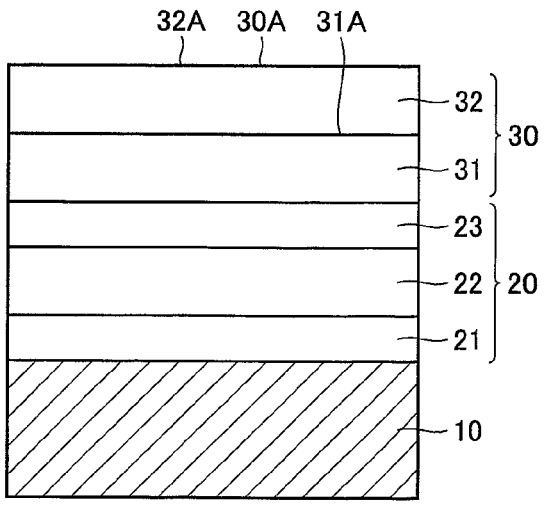
FIG. 6 is a schematic cross-sectional view for explaining the method of manufacturing the superconducting thin film material of the first embodiment.

Furthermore, a metal organic deposition step for forming metal organic deposition HoBCO layer 32 on physical vapor deposition HoBCO layer 31 by a metal organic deposition method is performed as shown in FIGS. 2 and 6. In this metal organic deposition step, a non-fluorine-containing application step for applying an organometallic salt solution of non-fluorine-containing Ho (holmium), Ba (barium) and Cu (copper), such as a metal acetylacetonate-containing solution (Ho:Ba:Cu=1:2:3) or a naphthenic acid-containing solution, on a surface of physical vapor deposition HoBCO layer 31 is performed first as shown in FIG. 3. A dipping method, a die coating method or the like can be selected as a method of applying the organometallic salt solution in this non-fluorine-containing solution application step.

Then, a preliminary firing step for removing a solvent component or the like from the applied organometallic salt solution is performed as shown in FIG. 3. Specifically, orientated metal substrate 10 where the organometallic salt solution has been applied is heated in the air having a temperature range not less than 400° C. and not more than 600° C., for example, 500° C. As a result, the applied organometallic salt solution is thermally decomposed. At this time, $CO_2$ (carbon dioxide) and $H_2O$ (water) separate and the solvent component or the like are removed from the applied organometallic salt solution. After the above-described preliminary firing step is performed, a main firing step is performed as shown in FIG. 3. Specifically, orientated metal substrate 10 where the organometallic salt solution has been applied is heated in a mixed atmosphere of Ar (argon) and $O_2$ (oxygen) having a temperature range not less than 600° C. and not more than 800° C., for example, 750° C. As a result, metal organic deposition HoBCO layer 32 as a desired metal organic deposition layer is formed.

Referring now to FIGS. 5 and 6, in physical vapor deposition HoBCO layer 31 formed by the physical vapor deposition as described above, the surface smoothness of a physical vapor deposition HoBCO layer surface 31A that is a surface of physical vapor deposition HoBCO layer 31 tends to be reduced as the film thickness is increased. In order to address this, since metal organic deposition HoBCO layer 32 having an excellent surface smoothness is formed on physical vapor deposition HoBCO layer 31 as described above, a metal organic deposition HoBCO layer surface 32A that is a surface of metal organic deposition HoBCO layer 32 having a high surface smoothness forms a superconductor film surface 30A that is a surface of oxide superconductor film 30. As a result, oxide superconductor film 30 having an excellent surface smoothness is formed and $I_C$, $J_C$ or the like of superconducting thin film material 1 is improved. Furthermore, by using as a seed film physical vapor deposition HoBCO layer 31 having its composition close to that of the target and having a high orientation to perform the metal organic deposition step, the nucleus growth of metal organic deposition HoBCO layer 32 is more easily accomplished.

As shown in FIG. 2, an Ag stabilizing layer formation step for forming Ag stabilizing layer 40 as a stabilizing layer is then performed. Ag stabilizing layer 40 can be formed by, for example, a vapor deposition method. By performing the above-described steps, superconducting thin film material 1 of the first embodiment is manufactured.

According to superconducting thin film material 1 of the present first embodiment and the method of manufacturing the same, there can be provided superconducting thin film material 1 that can realize attainment of an excellent property such as a high $J_C$ and a high $I_C$ and reduction of costs at the same time because respective disadvantages of a PLD method and a non-fluorine-containing MOD method are compensated for each other and their advantages are maximized.

In the present first embodiment, it is preferable that metal organic deposition HoBCO layer 32 has a thickness of not more than 1 μm. In metal organic deposition HoBCO layer 32 formed by an MOD method, internal defects such as voids are likely to be created as the film thickness is increased. If metal organic deposition HoBCO layer 32 has a thickness of not more than 1 μm, the creation of the internal defects such as voids can be suppressed with relative ease.

In the present first embodiment, it is preferable that physical vapor deposition HoBCO layer 31 has a thickness of not more than 2 μm. In physical vapor deposition HoBCO layer 31 formed by a PLD method, it is difficult to ensure the surface smoothness as the film thickness is increased. If physical vapor deposition HoBCO layer 31 has a thickness of not more than 2 μm, a good surface smoothness can be ensured with relative ease.

Second Embodiment

A configuration of a superconducting thin film material of a second embodiment that is an embodiment of the present invention will be described with reference to FIG. 7.

Figure 7:
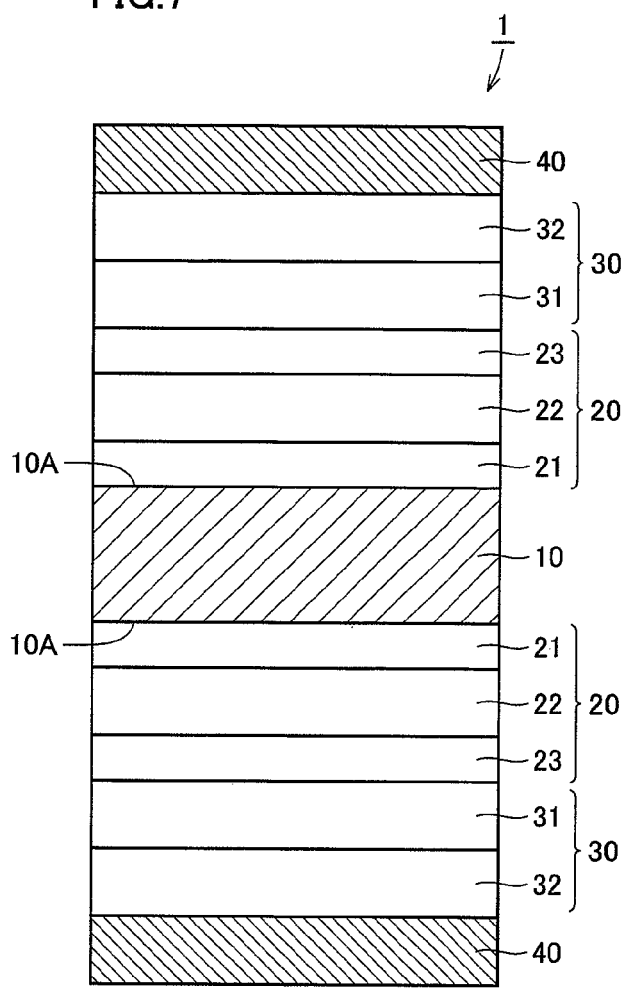
FIG. 7 is a schematic cross-sectional view of a configuration of a superconducting thin film material of a second embodiment.

Referring to FIG. 7, superconducting thin film material 1 of the second embodiment has a configuration basically similar to that of superconducting thin film material 1 of the first embodiment described above. However, superconducting thin film material 1 of the second embodiment differs from superconducting thin film material of the first embodiment in that intermediate layers 20, oxide superconductor films 30 and Ag stabilizing layers 40 are formed on both main surfaces of orientated metal substrate 10. In oxide superconductor film 30, as the film thickness is increased, a condition for the film formation needs to be exactly controlled because it becomes difficult to ensure the surface smoothness and to suppress internal defects such as voids. In order to address this, in the present second embodiment, since oxide superconductor films 30 are formed on both main surfaces 10A of orientated metal substrate 10, the film thickness of oxide superconductor film 30 on each main surface 10A required to ensure a desired $I_C$ can be reduced. As a result, it is easy to ensure the surface smoothness and to suppress the internal defects such as voids in oxide superconductor film 30 on each main surface 10A, and it is possible to ensure a sufficient $I_C$ by oxide superconductor films 30 on both main surfaces 10A.

Figure 8:
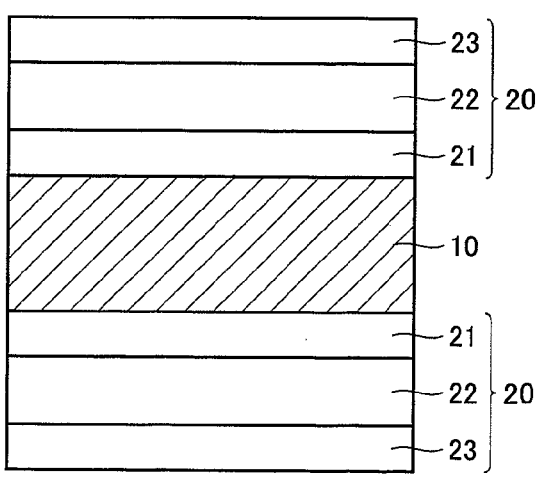
FIG. 8 is a schematic cross-sectional view for explaining a method of manufacturing the superconducting thin film material of the second embodiment.
Figure 9:
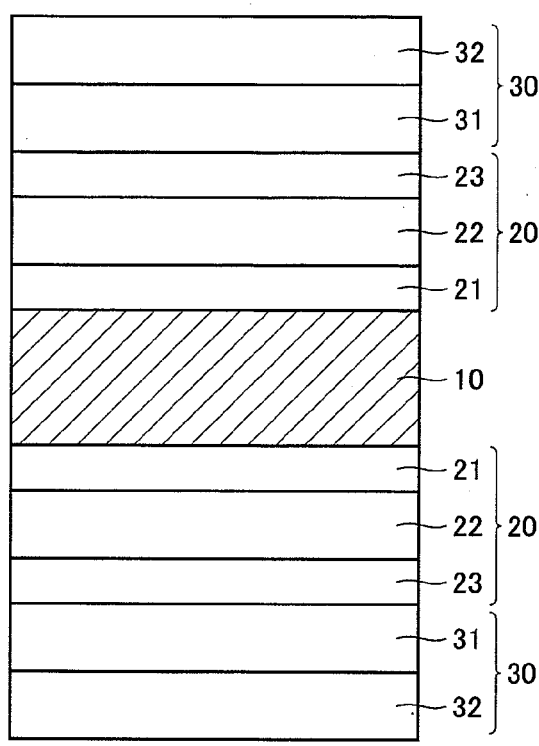
FIG. 9 is a schematic cross-sectional view for explaining the method of manufacturing the superconducting thin film material of the second embodiment.

The description of a method of manufacturing the superconducting thin film material of the second embodiment will follow with reference to FIGS. 7 to 9.

The method of manufacturing the superconducting thin film material of the second embodiment has a configuration basically similar to that of the method of manufacturing the superconducting thin film material of the first embodiment as described based on FIGS. 1 to 6. Referring to FIG. 2, however, the second embodiment differs from the first embodiment in that intermediate layers 20, oxide superconductor films 30 and Ag stabilizing layers 40 are formed on both main surfaces 10A of orientated metal substrate 10 respectively in the intermediate layer formation step, the superconductor film formation step and the Ag stabilizing layer formation step. Specifically, in the intermediate layer formation step, intermediate layers 20 made up of first $CeO_2$ layers 21, YSZ layers 22 and second $CeO_2$ layers 23 are formed on both main surfaces 10A of orientated metal substrate 10 as shown in FIG. 8. Then, in the superconductor film formation step, oxide superconductor films 30 are formed on both intermediate layers 20 respectively as shown in FIG. 9. Then, in the Ag stabilizing layer formation step, Ag stabilizing layers 40 are formed on both oxide superconductor films 30 respectively. As a result, superconducting thin film material 1 of the second embodiment shown in FIG. 7 is completed.

It should be noted that, in the intermediate layer formation step, the superconductor film formation step and the Ag stabilizing layer formation step, intermediate layers 20, oxide superconductor films 30 and Ag stabilizing layers 40 on both main surfaces 10A of orientated metal substrate 10 may be formed separately on each side, or may be formed simultaneously on both sides. In a case where physical vapor deposition HoBCO layers 31 are formed simultaneously on both main surfaces 10A by a physical vapor deposition method, they can be formed, for example, from both sides of orientated metal substrate 10 by a laser deposition method. In a case where metal organic deposition HoBCO layers 32 are formed simultaneously on both physical vapor deposition HoBCO layers 31 by a non-fluorine-containing metal organic deposition method, they can be formed by immersing orientated metal substrate 10 where physical vapor deposition HoBCO layers 31 have been formed into the organometallic salt solution by, for example, a dipping method.

Third Embodiment

A configuration of a superconducting thin film material of a third embodiment that is an embodiment of the present invention will be described with reference to FIG. 10.

Figure 10:
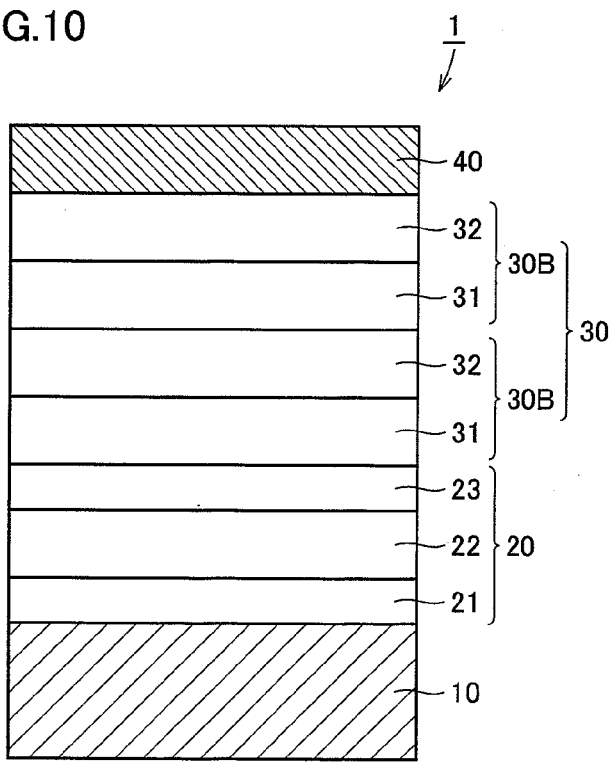
FIG. 10 is a schematic cross-sectional view of a configuration of a superconducting thin film material of a third embodiment.

Referring to FIG. 10, superconducting thin film material 1 of the third embodiment has a configuration basically similar to that of superconducting thin film material 1 of the first embodiment described above. However, superconducting thin film material 1 of the third embodiment differs from superconducting thin film material 1 of the first embodiment in that a plurality of structures made up of a combination of physical vapor deposition HoBCO layer 31 and metal organic deposition HoBCO layer 32 are stacked in oxide superconductor film 30. Specifically, a plurality of stacked structures 30B having metal organic deposition HoBCO layer 32 formed on physical vapor deposition HoBCO layer 31 are stacked and oxide superconductor film 30 is formed. Although FIG. 10 shows a configuration in which two stacked structures 30B are stacked, three or more stacked structures 30B may be stacked so that the desired film thickness of oxide superconductor film 30 is achieved.

As described above, in physical vapor deposition HoBCO layer 31 formed by a PVD method, it becomes difficult to ensure the surface smoothness as the film thickness is increased. In metal organic deposition HoBCO layer 32 formed by an MOD method, it becomes difficult to suppress the internal defects such as voids as the film thickness is increased. In order to address this, since physical vapor deposition HoBCO layer 31 is first formed, and then metal organic deposition HoBCO layer 32 is formed on physical vapor deposition HoBCO layer 31, the surface smoothness can be improved. Furthermore, since the film thickness of metal organic deposition HoBCO layer 32 is limited to such a degree that it is easy to suppress the internal defects such as voids, physical vapor deposition HoBCO layer 31 is again formed on the superconductor film having an improved surface smoothness, and additional metal organic deposition HoBCO layer 32 is formed on the physical vapor deposition HoBCO layer 31, the surface smoothness of oxide superconductor film 30 is again improved. Thus, since a plurality of structures made up of a combination of physical vapor deposition HoBCO layer 31 and metal organic deposition HoBCO layer 32 are stacked, it is easy to ensure the surface smoothness and to suppress the internal defects such as voids, and it is possible to form oxide superconductor film 30 having a sufficient film thickness. As a result, superconducting thin film material 1 that can ensure a desired superconducting property such as $I_C$ and $J_C$ can be obtained easily.

The description of a method of manufacturing the superconducting thin film material of the third embodiment will follow with reference to FIGS. 11 to 14.

Figure 11:
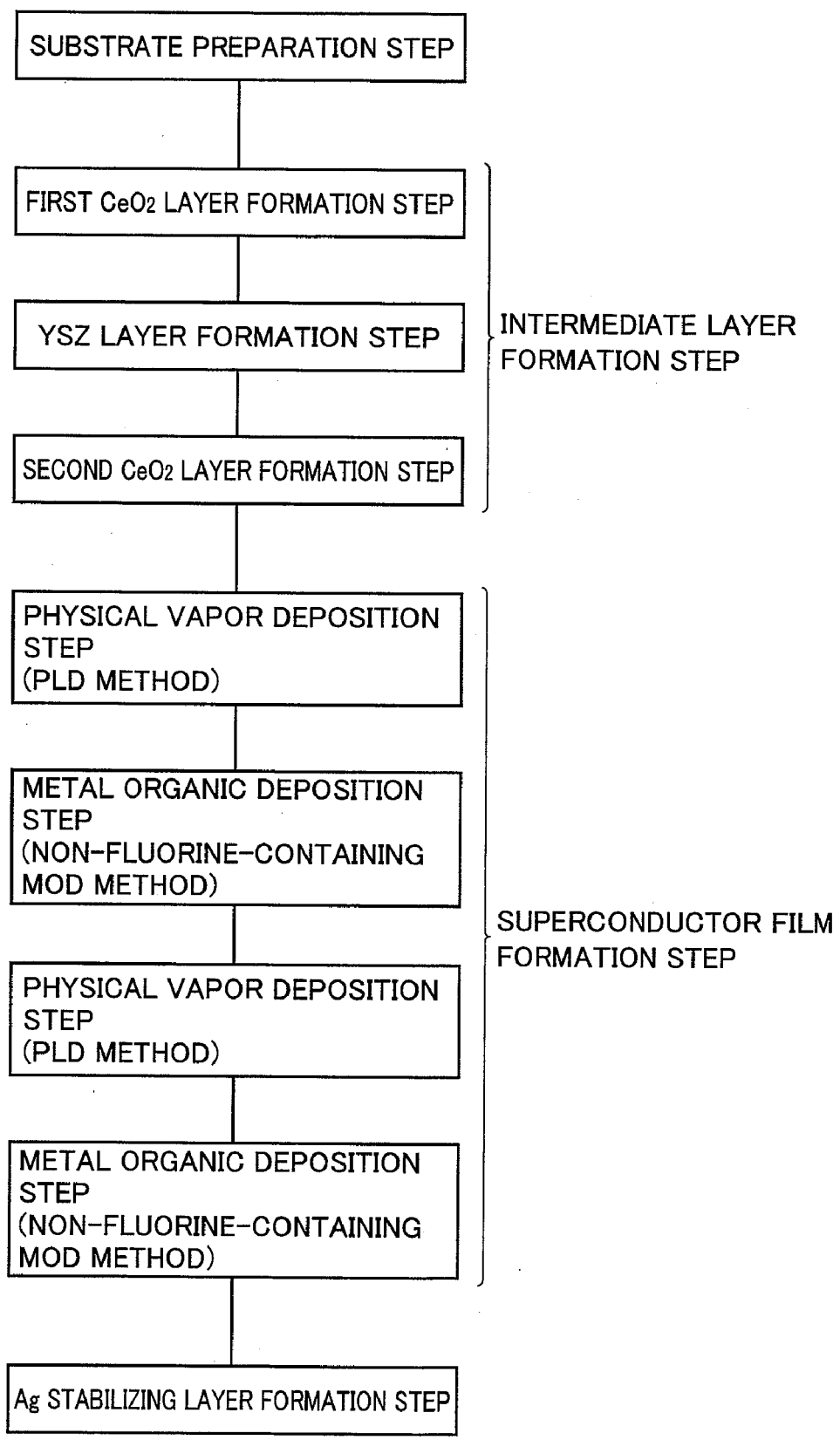
FIG. 11 is a chart showing the outline of manufacturing steps in a method of manufacturing the superconducting thin film material of the third embodiment.
Figure 12:
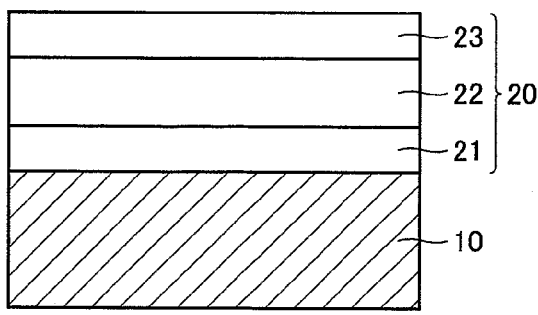
FIG. 12 is a schematic cross-sectional view for explaining the method of manufacturing the superconducting thin film material of the third embodiment.
Figure 13:
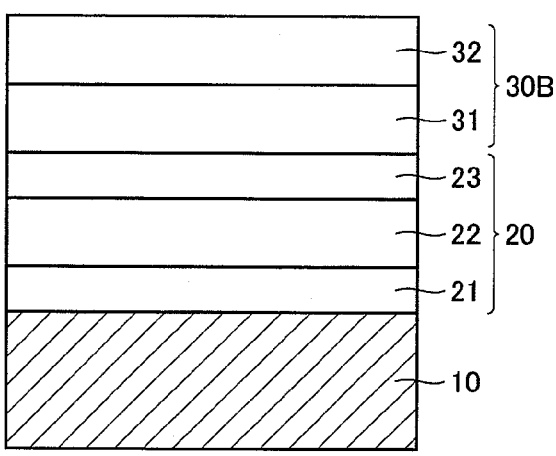
FIG. 13 is a schematic cross-sectional view for explaining the method of manufacturing the superconducting thin film material of the third embodiment.
Figure 14:
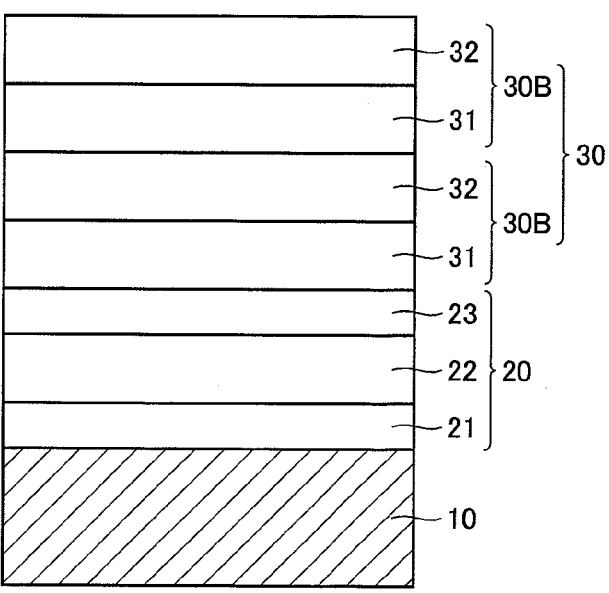
FIG. 14 is a schematic cross-sectional view for explaining the method of manufacturing the superconducting thin film material of the third embodiment.

The method of manufacturing the superconducting thin film material of the third embodiment has a configuration basically similar to that of the method of manufacturing the superconducting thin film material of the first embodiment described based on FIGS. 1 to 6. Referring to FIG. 11, however, the third embodiment differs from the first embodiment in that the physical vapor deposition step and the metal organic deposition step are alternately performed more than once in the superconductor film formation step. Specifically, in the superconductor film formation step, intermediate layer 20 made up of first $CeO_2$ layer 21, YSZ layer 22 and second $CeO_2$ layer 23 is formed on orientated metal substrate 10 as shown in FIG. 12. Then, stacked structure 30B having metal organic deposition HoBCO layer 32 formed on physical vapor deposition HoBCO layer 31 is formed on intermediate layer 20 as shown in FIG. 13. A method of forming physical vapor deposition HoBCO layer 31 and metal organic deposition HoBCO layer 32 is similar to that of the first embodiment. Furthermore, additional stacked structure 30B is formed on stacked structure 30B as shown in FIG. 14. Formation of these stacked structures 30B is repeated until the desired film thickness of oxide superconductor film 30 is achieved. Then, Ag stabilizing layer 40 is formed on oxide superconductor film 30. As a result, superconducting thin film material 1 of the third embodiment shown in FIG. 10 is completed.

In the third embodiment, it is preferable that each metal organic deposition HoBCO layer 32 has a thickness of not more than 1 μm. If each metal organic deposition HoBCO layer 32 has a thickness of not more than 1 μm, the creation of the internal defects such as voids can be suppressed with relative ease. Furthermore, in the third embodiment, it is preferable that each physical vapor deposition HoBCO layer 31 has a thickness of not more than 2 μm. If each physical vapor deposition HoBCO layer 31 has a thickness of not more than 2 μm, a good surface smoothness can be ensured with relative ease.

Although superconducting thin film materials 1 of the first to third embodiments of the present invention described above are, for example, wires in the form of a tape, they may be in the form of a sheet or may have a hollow or solid cylindrical shape.

Example 1

Example 1 of the present invention will be described below. A superconducting thin film material of the present invention was actually fabricated and a test was conducted to evaluate the property thereof. A procedure of the test was as follows.

First, a method of fabricating a sample to be tested will be described. The sample was fabricated by the manufacturing method shown in FIG. 2. Specifically, an intermediate layer with a three-layer structure ($CeO_2$ layer/YSZ layer/$CeO_2$ layer; these layers have thicknesses of 0.3 μm, 1.0 μm and 0.1 μm respectively) was formed on an Ni alloy-containing orientated metal tape having a thickness of 100 μm and a width of 10 mm, and then, a physical vapor deposition HoBCO layer having a film thickness of 1.0 μm was formed on the intermediate layer by a PLD method. Then, a metal organic deposition HoBCO layer having a film thickness of 0.2-3.0 μm was epitaxially grown on the physical vapor deposition HoBCO layer by a non-fluorine-containing MOD method. Then, an Ag stabilizing layer having a film thickness of 10 μm was formed on the metal organic deposition HoBCO layer. As a result, a wire having a width of 10 mm and a length of 1 m was fabricated. A short sample having a width of 10 mm and a length of 10 cm was taken from this wire and a test was conducted to examine a relationship between the film thickness of the metal organic deposition HoBCO layer (MOD film thickness) and an $I_C$. Furthermore, a test was conducted to create a pole figure of the metal organic deposition HoBCO layer by using X-ray diffraction and examine an in-plane orientation. In addition, the surface of the metal organic deposition HoBCO layer before the Ag stabilizing layer was formed was observed by using an Atomic Force Microscope (AFM).

Figure 15:
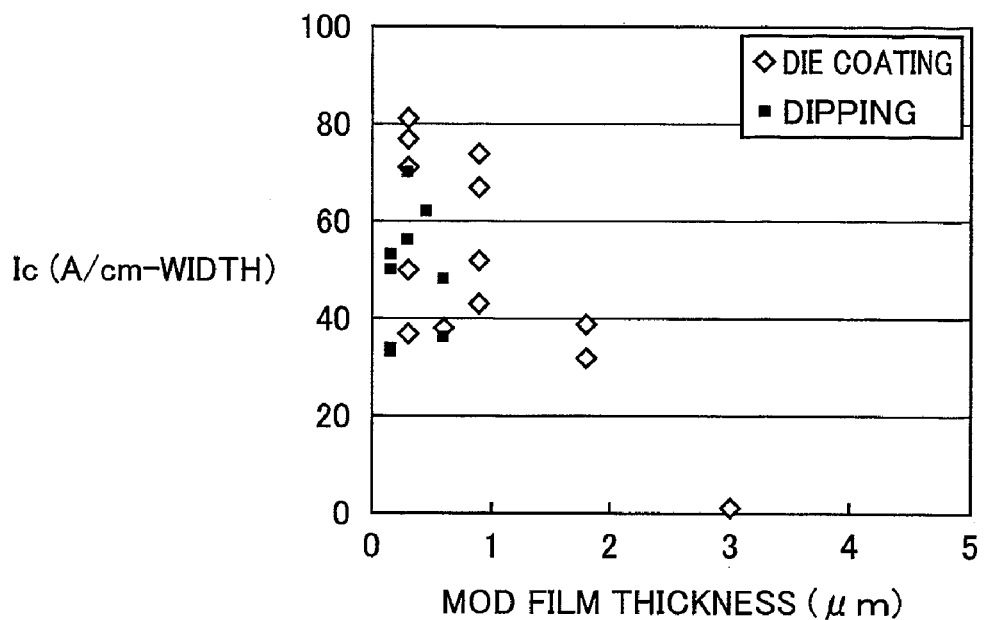
FIG. 15 is a graph showing a relationship between an MOD film thickness and an $I_C$ in the superconducting thin film material of Example 1.

Test results will be described with reference to FIG. 15. In FIG. 15, the horizontal axis indicates the film thickness of the metal organic deposition HoBCO layer formed on the physical vapor deposition HoBCO layer (MOD film thickness), and the vertical axis indicates a critical current ($I_C$). It should be noted that, in this Example 1, experiments were conducted regarding a case where the metal organic deposition HoBCO layer (MOD layer) was formed by a die coating method and a case where the metal organic deposition HoBCO layer (MOD layer) was formed by a dipping method. The dipping method is a method of adhering the organometallic salt solution onto the Ni alloy-containing orientated metal tape by immersing the Ni alloy-containing orientated metal tape into the organometallic salt solution in an MOD method. The die coating method is a method of adhering the organometallic salt solution onto the Ni alloy-containing orientated metal tape by coating the Ni alloy-containing orientated metal tape with the organometallic salt solution supplied from a solution tank in an MOD method. In FIG. 15, a result given by the die coating method is shown by a hollow rhombus, and a result given by the dipping method is shown by a solid square. Referring to FIG. 15, a relationship between an MOD film thickness and an $I_C$ in the superconducting thin film material of this Example 1 will be described.

Referring to FIG. 15, for the MOD film thickness up to about 1 μm, the $I_C$ is about 35-80 A/cm-width regardless of a method of forming the MOD layer. Therefore, it is seen that the MOD layer having a good property can be formed if the MOD film thickness is in a range up to about 1 μm.

The crystal growth of the MOD layer in the superconducting thin film material of Example 1 will be described with reference to FIGS. 16 and 17.

Figure 16:
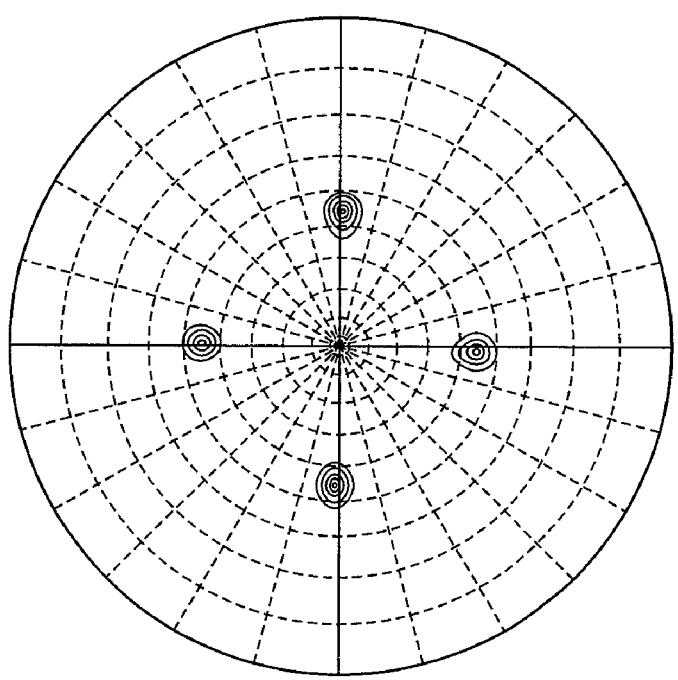
FIG. 16 is a (103) pole figure of the MOD layer in the superconducting thin film material of Example 1.
Figure 17:
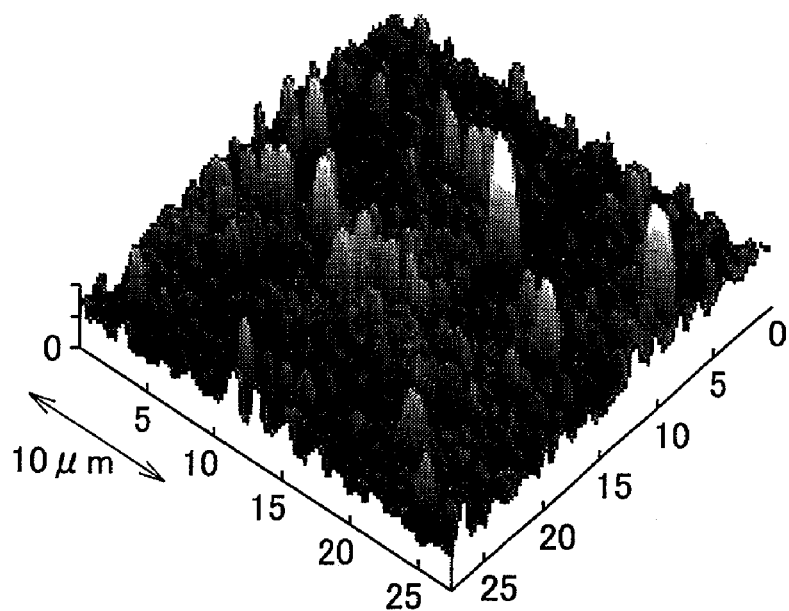
FIG. 17 is an AFM photograph of a surface of the MOD layer in the superconducting thin film material of Example 1.

Referring to FIG. 16, a peak corresponding to a (103) surface of the MOD layer has a half width of 6.5-6.9°. This shows that the MOD layer in the superconducting thin film material of Example 1 has a good in-plane orientation. Referring to FIG. 17, the crystal grains of the surface of the MOD layer in the superconducting thin film material of Example 1 have a diameter of 0.5-1 μm. As described above, it is seen that the crystal growth of good quality is realized in the MOD layer in the superconducting thin film material of the present invention.

In addition, in a manufacturing method similar to the above-described manufacturing method, a long wire was fabricated as a prototype by using a continuous application and firing device that can continuously apply and fire the organometallic salt solution in the metal organic deposition step to take up the superconducting thin film material of the present invention by a continuous reel take-up method. As a result, a long wire having a property similar to that of the above-described wire was able to be fabricated. This shows that there can be provided a long superconducting wire having an excellent superconducting property, for example a high $J_C$ and a high $I_C$, as described above according to the superconducting thin film material of the present invention.

Example 2

Example 2 of the present invention will be described below. A superconducting thin film material of the present invention was actually fabricated and an experiment was conducted to examine a relationship between a state at the formation of the MOD layer and an $I_C$. A procedure of the experiment was as follows.

First, an intermediate layer similar to that of Example 1 was formed on an orientated Ni alloy tape having a width of 3 cm and a thickness of 100 μm by a PLD method, and then an HoBCO layer (a physical vapor deposition HoBCO layer) having a thickness of 1.5 μm was formed on the intermediate layer by a PLD method. Furthermore, an HoBCO layer (a metal organic deposition HoBCO layer) having a thickness of 0.3-3.0 μm was formed on the physical vapor deposition HoBCO layer by a non-fluorine-containing MOD method. Then, an Ag stabilizing layer having a thickness of 10 μm was formed on the metal organic deposition HoBCO layer. As a result, the superconducting thin film material of the present invention was fabricated.

$I_C$ was measured for the fabricated superconducting thin film material and a cross section of the superconducting thin film material was observed in a direction of the thickness by a Scanning Electron Microscope (SEM).

A relationship between a state at the formation of the metal organic deposition HoBCO layer and an $I_C$ will be described with reference to FIGS. 18 to 21. It should be noted that measured values of $I_C$ and MOD film thicknesses are denoted in FIGS. 18 to 21.

Figure 18:
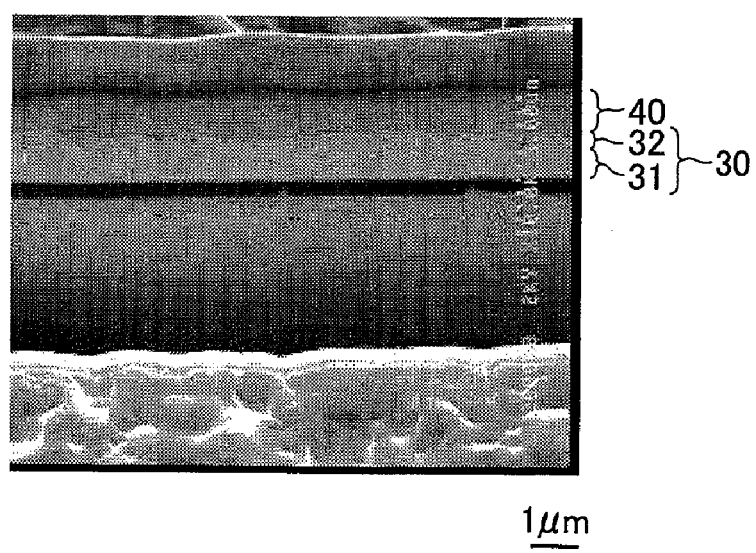
FIG. 18 is an SEM photograph of a cross section of a fabricated superconducting thin film material in a direction of the thickness.
Figure 19:
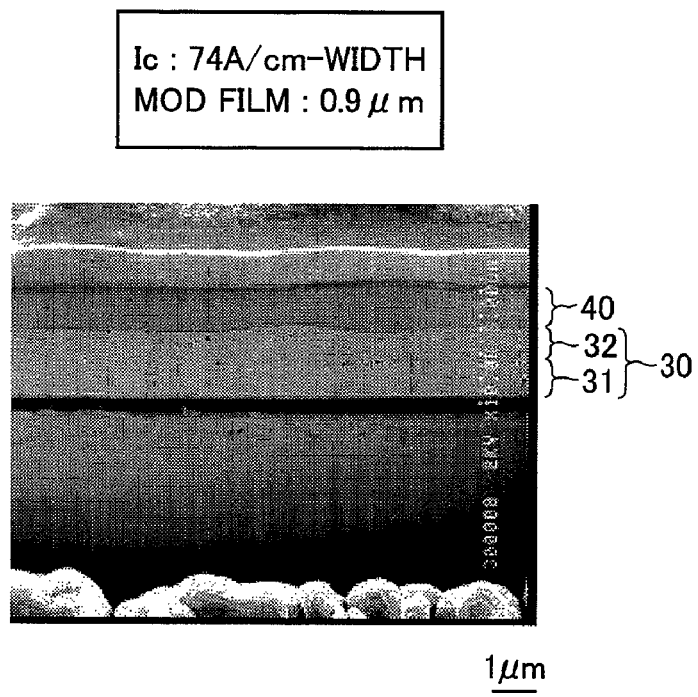
FIG. 19 is an SEM photograph of a cross section of a fabricated superconducting thin film material in a direction of the thickness.

As shown in FIG. 18, when metal organic deposition HoBCO layer 32 formed on physical vapor deposition HoBCO layer 31 had a thickness of 0.3 μm, metal organic deposition HoBCO layer 32 was dense. The measured $I_C$ was 81 A/cm-width ($J_C$ was 2.5 MA/cm$^2$) and an excellent superconducting property was obtained. As shown in FIG. 19, when metal organic deposition HoBCO layer 32 had a thickness of 0.9 μm, very few voids and different phases were observed in metal organic deposition HoBCO layer 32, but the measured $I_C$ was 74 A/cm-width and an excellent superconducting property was obtained.

Figure 20:
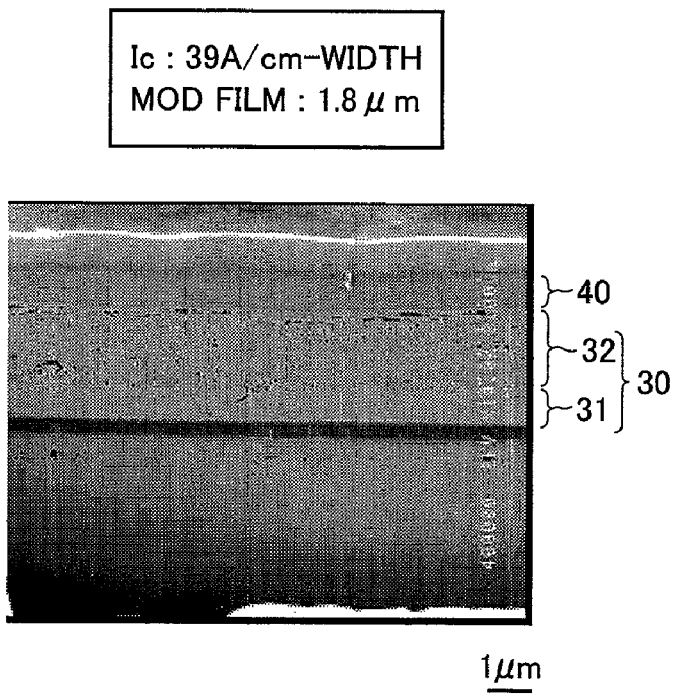
FIG. 20 is an SEM photograph of a cross section of a fabricated superconducting thin film material in a direction of the thickness.
Figure 21:
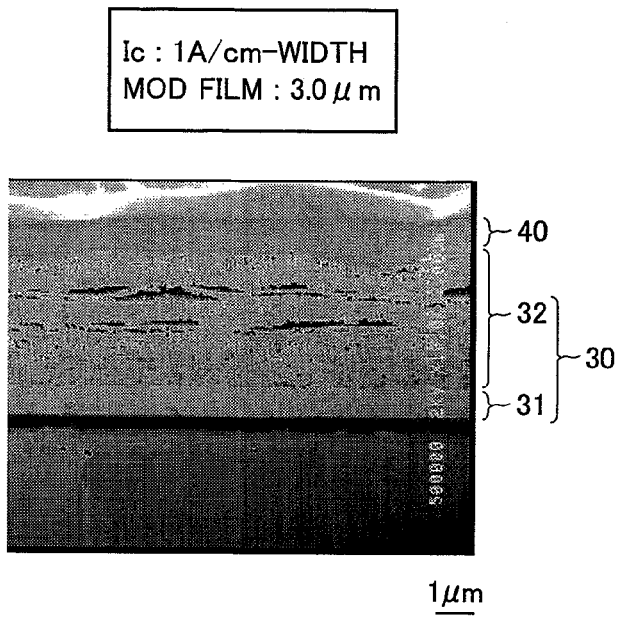
FIG. 21 is an SEM photograph of a cross section of a fabricated superconducting thin film material in a direction of the thickness.

On the other hand, as shown in FIG. 20, when metal organic deposition HoBCO layer 32 had a thickness of 1.8 μm, voids and different phases were clearly observed in metal organic deposition HoBCO layer 32. The measured $I_C$ was 39 A/cm-width and a superconducting property was clearly reduced as compared to that of the above-described FIGS. 18 and 19 in which metal organic deposition HoBCO layer 32 had a thickness of not more than 1 μm. As shown in FIG. 21, when metal organic deposition HoBCO layer 32 had a thickness of 3.0 μm, many voids and different phases were clearly observed in metal organic deposition HoBCO layer 32. The measured $I_C$ was 1 A/cm-width and a superconducting property was significantly reduced.

The greatest advantage of a non-fluorine-containing MOD method is that a large-area film can be formed easily. As described above, it was seen that the intermediate layer, the superconductor film and the Ag stabilizing layer were formed on the wide orientated Ni alloy tape and the thickness of the MOD layer was set to not more than 1 μm, and thus a large-area superconducting thin film material having a good superconducting property was able to be fabricated.

Example 3

Example 3 of the present invention will be described below. A superconducting thin film material as an example of the present invention including a superconductor film with a metal organic deposition layer formed on a physical vapor deposition layer, and a superconducting thin film material as a comparative example including a superconductor film formed only of a physical vapor deposition layer were fabricated and a test was conducted to compare their superconducting properties.

First, as an example of the present invention, a superconducting thin film material similar to that of Example 1 was fabricated similarly to Example 1 by the manufacturing method shown in FIG. 2. The thickness of a physical vapor deposition HoBCO layer was set to 0.8 µm and a metal organic deposition HoBCO layer having a thickness of not more than 1 µm was deposited on the physical vapor deposition HoBCO layer, so that the superconductor film was formed. On the other hand, as a comparative example, a superconducting thin film material whose superconductor film was only different from that of the superconducting thin film material of the example was fabricated. In the comparative example, the superconductor film was formed only of the physical vapor deposition HoBCO layer as described above.

A test was conducted on the superconducting thin film material fabricated in this way to measure $I_C$ and $J_C$ under a condition that the temperature was 77 K and the magnetic field was 0 T.

Relationships between the film thicknesses of the superconductor films and $I_C$s in the superconducting thin film materials as the example of the present invention and as the comparative example that is outside the scope of the present invention will be described with reference to FIG. 22. It should be noted that the horizontal axis indicates the film thickness of the superconductor film and the vertical axis indicates the $I_C$ in FIG. 22. Square dots indicate measured values for the example and circular dots indicate measured values for the comparative example.

Figure 22:
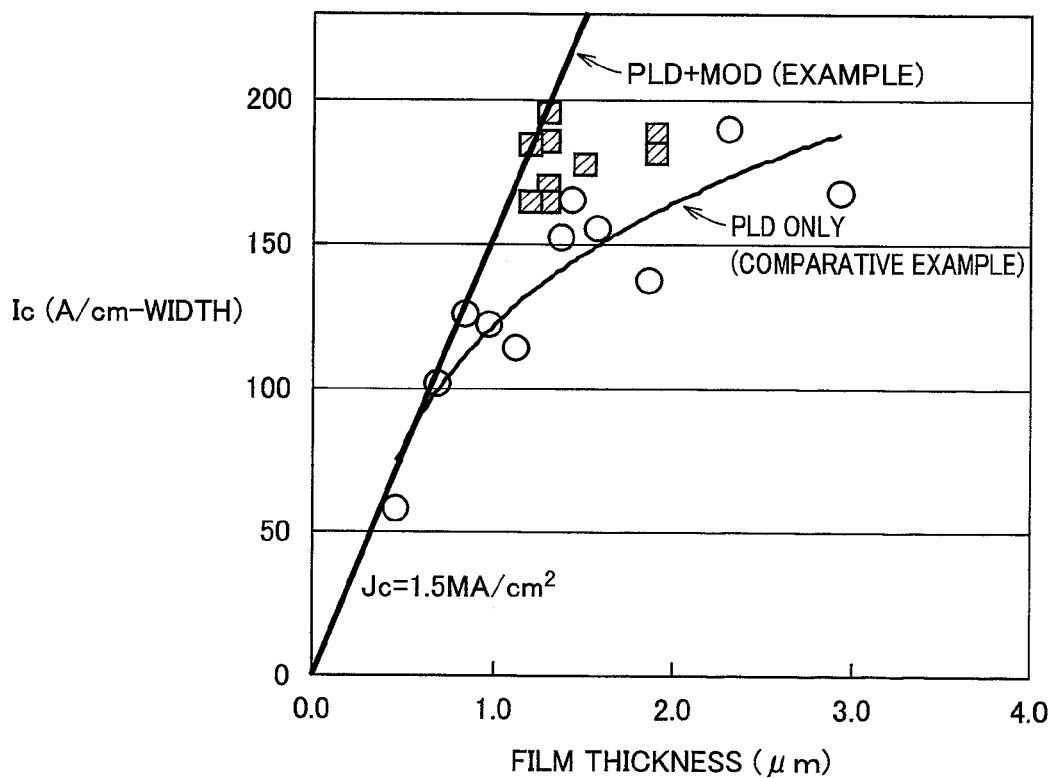
FIG. 22 is a graph showing relationships between film thicknesses of superconductor films and $I_C$s in a superconducting thin film material of an example of the present invention and that of a comparative example that is outside the scope of the present invention.

Referring to FIG. 22, in the superconducting thin film material of the comparative example in which the superconductor film is formed only of the physical vapor deposition HoBCO layer, for the film thickness of up to about 1 µm, the $I_C$ rises approximately in proportion to an increase in the film thickness. However, the rise in the $I_C$ relative to the increase in the film thickness tends to become small as the film thickness is increased, and for the film thickness of not less than 2 µm, the rise in the $I_C$ is clearly small. It is assumed that this is because the surface smoothness becomes worse as the film thickness is increased when the superconductor film is formed by a PLD method as described above. In comparison, in the superconducting thin film material of the example of the present invention including the superconductor film with the metal organic deposition layer formed on the physical vapor deposition layer, the $I_C$ rises approximately in proportion to an increase in the film thickness even though the film thickness exceeds 1 µm. The $I_C$ is 196 A/cm-width and the $J_C$ is 1.5 MA/cm² at the maximum. As described above, according to the superconducting thin film material of the present invention, it is seen that the film thickness of the superconductor film is increased, and thus the $I_C$ can be improved efficiently, as compared to the superconducting thin film material having the superconductor film formed only of the physical vapor deposition layer.

Based on the above-described test results regarding the comparative example, it is assumed that the physical vapor deposition layer preferably has a thickness of not more than 2 µm, and more preferably not more than 1 µm, in the superconducting thin film material of the present invention as well in order to suppress a worsening of the surface smoothness of the physical vapor deposition layer.

Example 4

Example 4 of the present invention will be described below. A superconducting thin film material of the present invention having superconductor films formed on both main surfaces of an Ni alloy substrate was fabricated and a test was conducted to examine $I_C$.

First, as an example of the present invention, a superconducting thin film material was fabricated similarly to Example 1 by the manufacturing method shown in FIG. 2. In the superconductor films, however, physical vapor deposition HoBCO layers having thicknesses of 0.4 µm and metal organic deposition HoBCO layers having thicknesses of 0.4 µm were formed on intermediate layers formed on both main surfaces of an Ni alloy substrate respectively. Then, $I_C$ of the superconducting thin film material was measured under a condition similar to that of Example 3.

The result was that, in the superconducting thin film material of the present example, the $I_C$ was 82 A/cm-width on one surface side of the Ni alloy substrate and 109 A/cm-width on the other surface side. Therefore, when both surfaces were combined together, the $I_C$ of the superconducting thin film material of the present example was 191 A/cm-width. Since the superconductor films are formed on both main surfaces of the Ni alloy substrate as in the present example, it is possible to reduce the thickness of the superconductor film on each main surface required to ensure a desired $I_C$ and it is easy to ensure the surface smoothness and to suppress internal defects such as voids in the superconductor film on each main surface. It is seen from the above-described test result that it is possible to ensure a sufficient $I_C$ by the superconductor films on both main surfaces.

Example 5

Example 5 of the present invention will be described below. A superconducting thin film material of the present invention was fabricated in the form of a wide wire as a prototype. Specifically, the superconducting thin film material of the present invention was fabricated by a method similar to that of Example 1 by using an Ni alloy tape having a width of 5 cm as a substrate. Then, $J_C$ of the superconducting thin film material was measured under a condition similar to that of Example 3.

It was seen from the result that uniform distribution of the $J_C$ of 1.4 MA/cm²±14% was obtained across the superconducting thin film material having a width of 5 cm. In the present example, a metal organic deposition HoBCO layer was formed by employing a die coating method. That is, it was confirmed that the superconducting thin film material of the present invention can be widened by using a wide die in the die coating method.

It should be understood that the embodiments and examples disclosed herein are illustrative and not limitative in any respect. The scope of the present invention is defined by the terms of the claims, rather than the embodiments and examples above, and is intended to include any modifications within the scope and meaning equivalent to the terms of the claims.

INDUSTRIAL APPLICABILITY

A superconducting thin film material of the present invention and a method of manufacturing the same can be especially advantageously applied to a superconducting thin film material having a superconductor film formed on a substrate and a method of manufacturing the same.

The invention claimed is:

1. A superconducting thin film material, comprising:
a substrate; and
a superconductor film formed on said substrate,
said superconductor film including
a physical vapor deposition layer formed by a physical vapor deposition method, and
a metal organic deposition layer formed on said physical vapor deposition layer by a metal organic deposition method, wherein
a plurality of structures made up of a combination of said physical vapor deposition layer and said metal organic deposition layer are stacked in said superconductor film.

2. The superconducting thin film material according to claim 1, further comprising an intermediate layer between said substrate and said superconductor film.

3. The superconducting thin film material according to claim 1, wherein
said superconductor film is formed on each of both main surfaces of said substrate.

4. A method of manufacturing a superconducting thin film material, comprising:
a substrate preparation step for preparing a substrate; and
a superconductor film formation step for forming a superconductor film on said substrate,
said superconductor film formation step including
a physical vapor deposition step for forming a physical vapor deposition layer by a physical vapor deposition method, and
a metal organic deposition step for forming a metal organic deposition layer on said physical vapor deposition layer by a metal organic deposition method,
wherein the physical vapor deposition step and the metal organic deposition step are alternately performed more than once.

5. The superconducting thin film material according to claim 1, wherein
said metal organic deposition layer has a thickness of not more than 1 μm.

6. The superconducting thin film material according to claim 1, wherein
said physical vapor deposition layer has a thickness of not more than 2 μm.

7. The superconducting thin film material according to claim 1, wherein
said metal organic deposition method is a non-fluorine-containing metal organic deposition method without using a fluorine-containing organometallic salt solution.

* * * * *